United States Patent [19]

Ridkosil

[11] Patent Number: 5,055,845
[45] Date of Patent: Oct. 8, 1991

[54] SIGNAL DIGITIZING METHOD AND SYSTEM UTILIZING TIME DELAY OF THE INPUT SIGNAL

[75] Inventor: Frank Ridkosil, Hackensack, N.J.
[73] Assignee: Datajet, Inc., Los Angeles, Calif.
[21] Appl. No.: 406,585
[22] Filed: Sep. 13, 1989

Related U.S. Application Data

[63] Continuation-in-part of Ser. No. 274,605, Nov. 18, 1988, which is a continuation of Ser. No. 595,255, Mar. 30, 1984, abandoned.
[51] Int. Cl.$^5$ .............................................. H03M 1/12
[52] U.S. Cl. ...................................... 341/155; 328/151
[58] Field of Search ............... 341/155, 124, 122, 158, 341/165, 166; 328/150, 151; 307/234, 350, 351, 354

[56] References Cited

U.S. PATENT DOCUMENTS

| | | | |
|---|---|---|---|
| 4,198,608 | 4/1980 | Comley | 328/162 |
| 4,565,993 | 1/1986 | Brian | 341/155 |
| 4,789,838 | 12/1988 | Cheng | 328/150 |

Primary Examiner—A. D. Pellinen
Assistant Examiner—Brian Young
Attorney, Agent, or Firm—Burns, Doane, Swecker & Mathis

[57] ABSTRACT

A circuit and method for representing in digital form information about the time and amplitude characteristic of a time-varying input signal. The time-varying input signal is delayed and the magnitudes of the time-varying input signal and its delayed version are compared to produce a digital signal representing the time characteristic of the input signal in the form of a transition in a digital output signal each time the magnitudes of the compared signals have a predetermined relationship. The predetermined relationship may be a condition of approximate equality or when the magnitude of the larger of the compared signals becomes less than the magnitude of the smaller of the compared signals. The invention also includes a circuit for outputting a digital representation of the amplitude of the time-varying input signal for each transition of said digital output signal. The circuits thus provide separate digital representations of the time and amplitude of each peak and valley of an analog or other time-varying input signal.

27 Claims, 9 Drawing Sheets

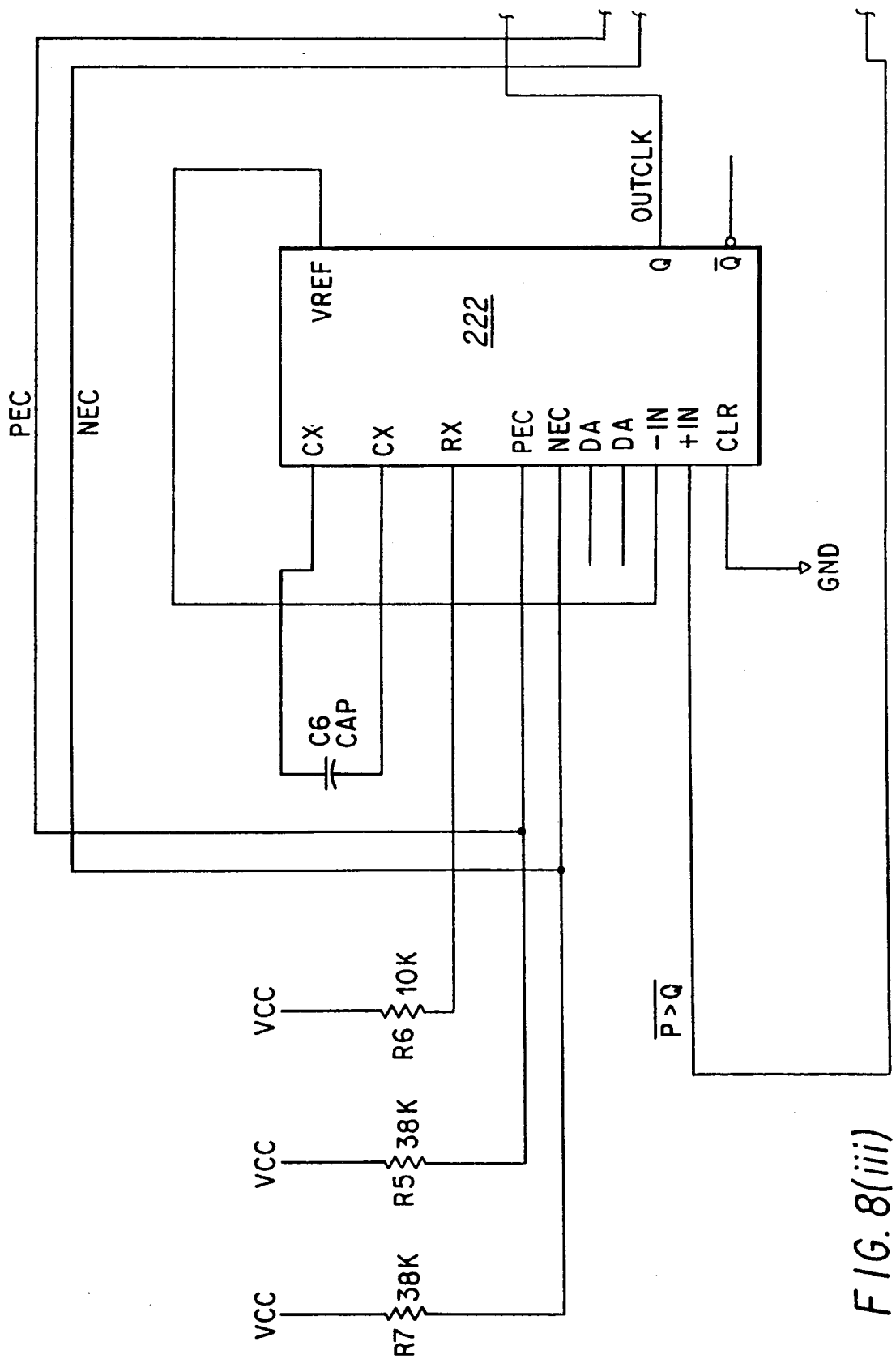
FIG. 8(iii)

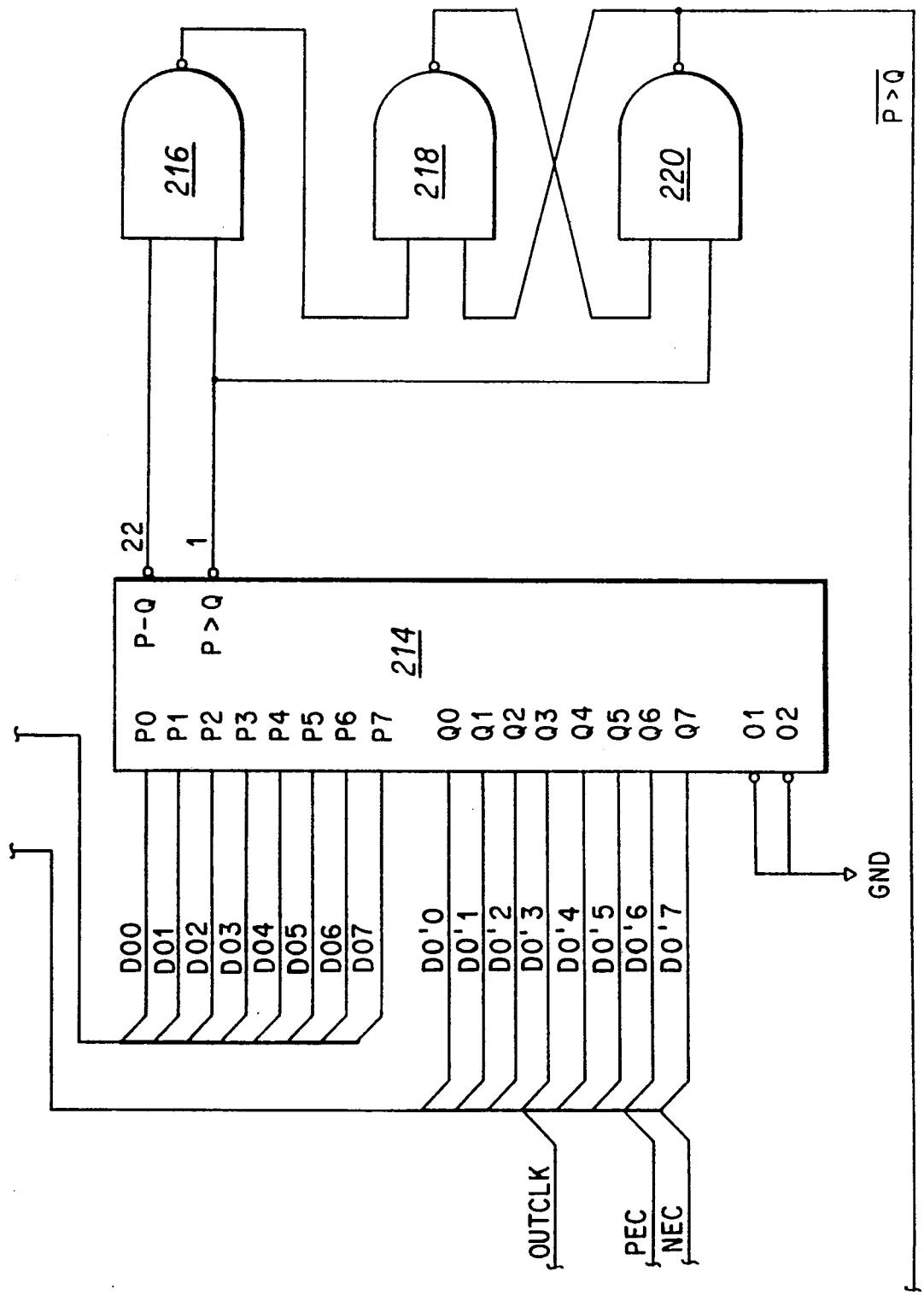
FIG. 8(iiii)

SIGNAL DIGITIZING METHOD AND SYSTEM UTILIZING TIME DELAY OF THE INPUT SIGNAL

RELATED APPLICATION

This is a continuation-in-part of U.S. Pat. application Ser. No. 274,605, filed Nov. 18, 1988 by Frank Ridkosil and now abandoned, which application is a continuation of U.S. Pat. application Ser. No. 595,255, filed Mar. 30, 1984, now abandoned.

BACKGROUND OF THE INVENTION

This invention relates generally to a method and system for digitizing signals and, more particularly, to a method and system for extracting time and amplitude information from an analog signal and providing separate digital representations thereof.

Signal digitizing circuits such as analog to digital converters are used in a variety of applications, particularly in communications. For example, speech or other analog signals are increasingly represented by digital values for storage, transmission, or the like. Of course, the original analog signal must be converted to a digital form prior to such storage or transmission.

One common way to digitize an analog signal is to sample the signal at a regularly repeating sampling interval, determine the magnitude of each sample, and represent the magnitude in a digital form such as binary or binary coded decimal. The digital representation of the analog signal thus is a sequence of magnitudes of the signal, each expressed as a binary word or in some other suitable digital format, where the time between each digital magnitude is uniform and is a function of the rate of the clock used to sample the analog signal.

It will be appreciated that with such an analog-to-digital conversion system, to achieve any useful degree of accuracy in signal reproduction, the clock or sampling rate of the system must be considerably higher than the highest expected frequency of the analog signal. Otherwise, complete half-cycles or cycles of the analog signal may be lost, or at least insufficient information about signal reversals will be available in digital form to accurately reproduce the analog signal. It will also be appreciated that the number of samples will be a function of the clock rate and not the signal being digitized. Therefore, an audio signal having a wide dynamic frequency range will have many more samples per cycle for signals at the low frequency end than for signals at the high frequency end.

OBJECTS AND SUMMARY OF THE INVENTION

It is an object of the present invention to provide a simple analog-to-digital signal conversion circuit.

It is another object of the present invention to provide a novel method and system for digitizing analog signals wherein the amount of data required to accurately represent the analog signal is minimized.

It is a further object of the present invention to provide a novel method and system for extracting time information from an analog signal and representing such information in digital form.

It is yet another object of the present invention to provide a novel method and system for detecting the peaks and valleys of an analog signal.

It is still another object of the present invention to provide a novel method and system for extracting time and amplitude information from an analog signal wherein the extracted time information is separate from the amplitude information, and the extracted time and amplitude information can be manipulated independently of each other.

The foregoing and other objects are achieved by this invention which, in accordance with one embodiment, digitizes an analog signal and produces a binary signal responsive to the analog signal. The binary signal represents the time between peaks and valleys of the analog signal and appears as a sequence of binary states corresponding to the peaks and valleys of the analog waveform. Advantageously, the binary signal changes state each time there is a reversal of the analog signal, i.e., a peak or valley, whether the reversal occurs at a negative or positive voltage level, i.e., whether the amplitude of the peak or valley is negative or positive.

According to the invention, the analog signal and a delayed version of the analog signal are compared. Each time the amplitudes of the compared signals are substantially equal or differ by some predetermined value, this condition is detected as an indication of the time or frequency component of the analog signal. Since the condition of equality or near equality of the analog signal and its delayed version occurs at a peak or valley, an output signal, preferably a binary level change for each condition of equality or near equality, will provide the time between peaks and valleys of the analog signal. The amplitude of the analog signal can be sampled at the time of each binary level change to provide, as a separate output, the amplitude of each peak and valley.

In one highly advantageous embodiment of the invention, digitizing circuitry is provided with a preamplifier for receiving an analog version of an incoming signal. The preamplifier is coupled at its output to a bistate circuit which produces a sequence of binary states corresponding to the peaks and valleys of the incoming analog signal. The preamplifier is formed of an amplifier having inverting and noninverting inputs and outputs. The noninverting input is coupled to a reference potential, and the analog signal is received at the inverting input terminal. Thus, the analog signal provided at the output of the preamplifier is an inversion.

The bistate circuit also comprises a comparator having inverting and noninverting inputs, and an output; the inputs and the output being connected to each other via a resistive divider circuit. In a preferred embodiment, the noninverting input of the comparator in the bistate circuit is coupled to the node of the resistive divider circuit. Also a capacitor is connected at one terminal thereof to the node, and at its other terminal to a reference potential. The values of the resistors in the resistive divider circuit, and the capacitor may be selected to produce a response time illustratively on the order of microseconds. Such a time constant governs the transitions between the binary states of the binary signal.

Of course, it will be appreciated that the delay between the analog signal and its delayed version can be introduced by a variety of means. One such means disclosed hereinafter is a digital circuit that samples the analog signal and introduces a digital delay of one clock pulse. Such a system is particularly advantageous because it may be used with a variety of analog signals in different applications merely by adjusting the clock rate as a function of the highest expected frequency of the analog input signal. For example, the clock rate may be set at about twice the highest expected frequency of the analog input signal, and preferably higher.

The present invention provides a high speed digitizing system which produces transitions between the binary states illustratively on the order of microseconds. From the standpoint of digital signal processing for applications where only time, e.g., frequency or phase information, is important, overall processing speed is substantially increased and circuit complexity is substantially decreased by permitting the extraction of time information without the need to process amplitude information. Also, in applications where only time information is necessary, data compaction is achieved directly in the conversion circuit. The present digitizing arrangement therefore provides significant advantages and economy over conventional systems such as those which utilize expensive and complex filter banks.

BRIEF DESCRIPTION OF THE DRAWINGS

Comprehension of the invention is facilitated by reading the following detailed description in conjunction with the annexed drawings, in which.

DETAILED DESCRIPTION

Figure 1:
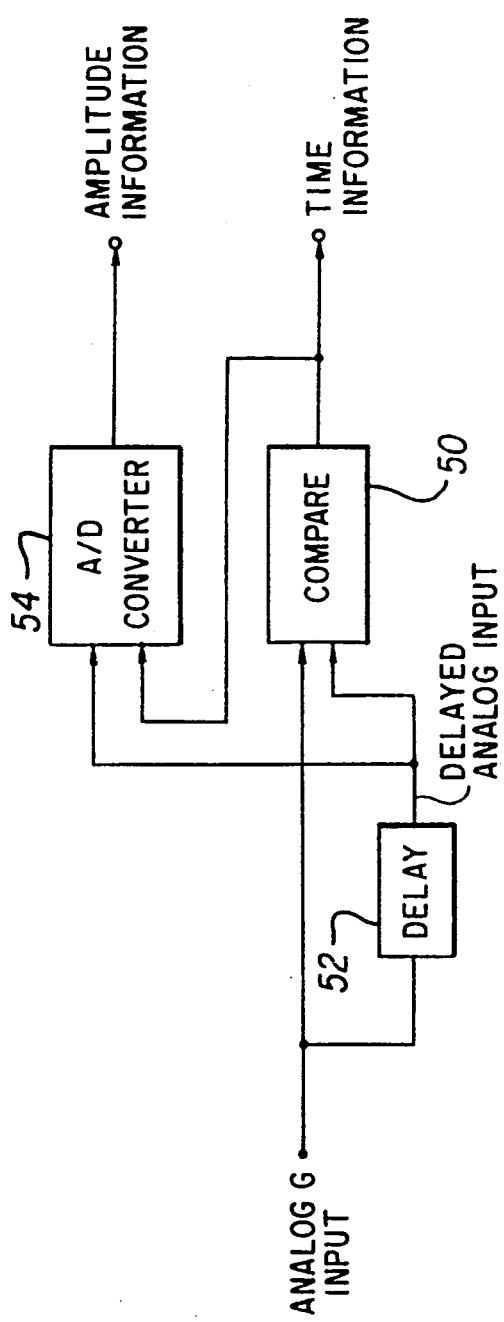
FIG. 1 is a functional block diagram generally illustrating the principles of the present invention.

Referring to FIG. 1, an analog input signal of the type, for example, encountered in voice communications, is applied to one input terminal of a suitable conventional signal compare or comparator circuit 50. The analog signal also is applied through a suitable conventional delay circuit 52 to a second input terminal of the compare circuit 50. The output signal of the delay circuit 52 also is applied to the data input terminal of a suitable conventional analog to digital (A/D) converter 54. The output signal from the compare circuit 50 is provided as a time information output signal and is also applied to a trigger input terminal of the A/D converter 54. The digital output signal from the A/D converter 54 is supplied as the amplitude information output signal.

Figure 1A:
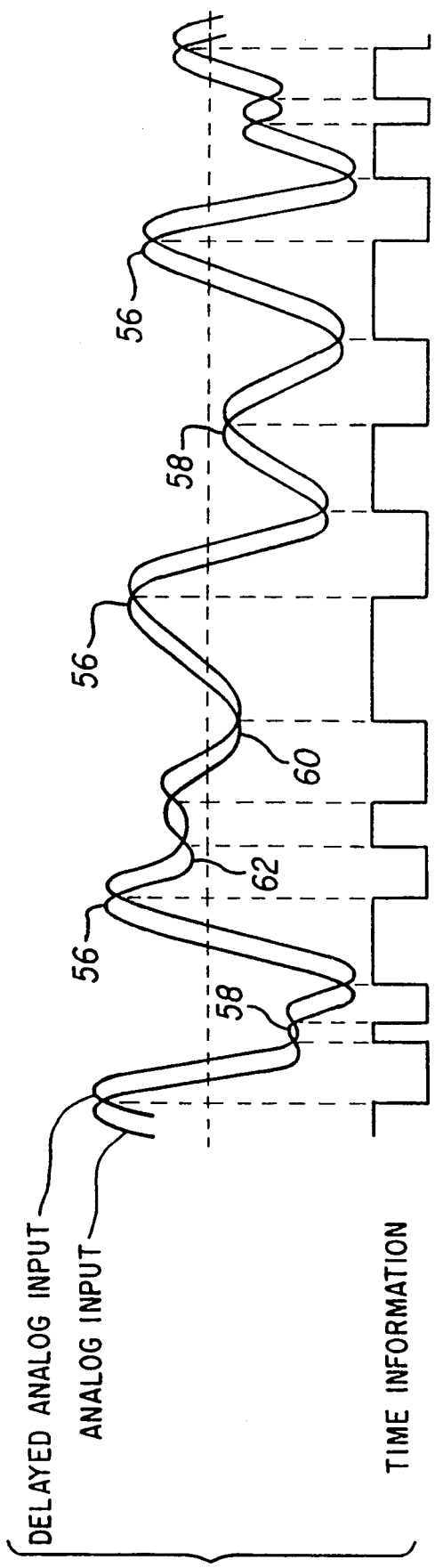
FIG. 1A is an illustration of typical waveforms of signals processed in accordance with the principles of FIG. 1.

The operation of the invention as embodied in FIG. 1 may be more fully appreciated with reference to FIG. 1A which illustrates the signals applied to and produced by the circuit of FIG. 1. The analog input is illustrated as a signal which varies in amplitude with time. It can be seen that this time-varying amplitude creates peaks and valleys where the amplitude variation of the signal changes direction. Some of the peaks positive-going to negative-going reversals are positive as indicated at 56 (assuming that the dotted, horizontal line represents zero volts d.c.) and some of the peaks are negative as indicated at 58. Likewise, some of the valleys (negative-going to positive-going reversals) are negative as indicated at 60, while others are positive as indicated at 62.

With continued reference to FIGS. 1 and 1A, the delayed analog input does not reverse directions until after the analog input has done so, so the two signals cross just after each reversal of the analog input. This crossing of the two signals is a point of equal voltage (or current in the case of current signals). The compare circuit 50 detects this point of equal value (e.g., voltage or current amplitude) and outputs a change of binary state.

It will thus be appreciated that each peak and valley of the analog input signal will be represented by a change in the binary output level of the compare circuit 50 and that the sequence of change in binary levels will represent the time between peaks and valleys of the analog signal. This time information or data is, of course, related to the frequency of the analog signal so the resultant output signal of the compare circuit 50 represents time or frequency information extracted from the analog signal.

The analog input signal, preferably in its delayed form, is applied to the data input terminal of the A/D converter 54. The time data extracted from the analog input is applied to the A/D converter 54 as a trigger to cause the A/D converter 54 to sample the delayed analog signal and provide a digital output signal representative of the amplitude of the delayed analog signal each time the binary time data signal changes binary level. Thus, the time of each peak and valley is available as the time information output signal, and the amplitude of each peak and valley is separately available as the amplitude information signal (not shown in FIG. 1A). Of course, the time and amplitude data for each peak and valley appear almost simultaneously at the respective output terminals since the amplitude data is generated in response to the time data. It will be appreciated by one skilled in the art, however, that certain slight delays may be introduced by the circuits or by methods employed for comparison, sampling, or the like. Delays may be introduced, if necessary, to counteract circuit delays and increase accuracy.

Figure 2:
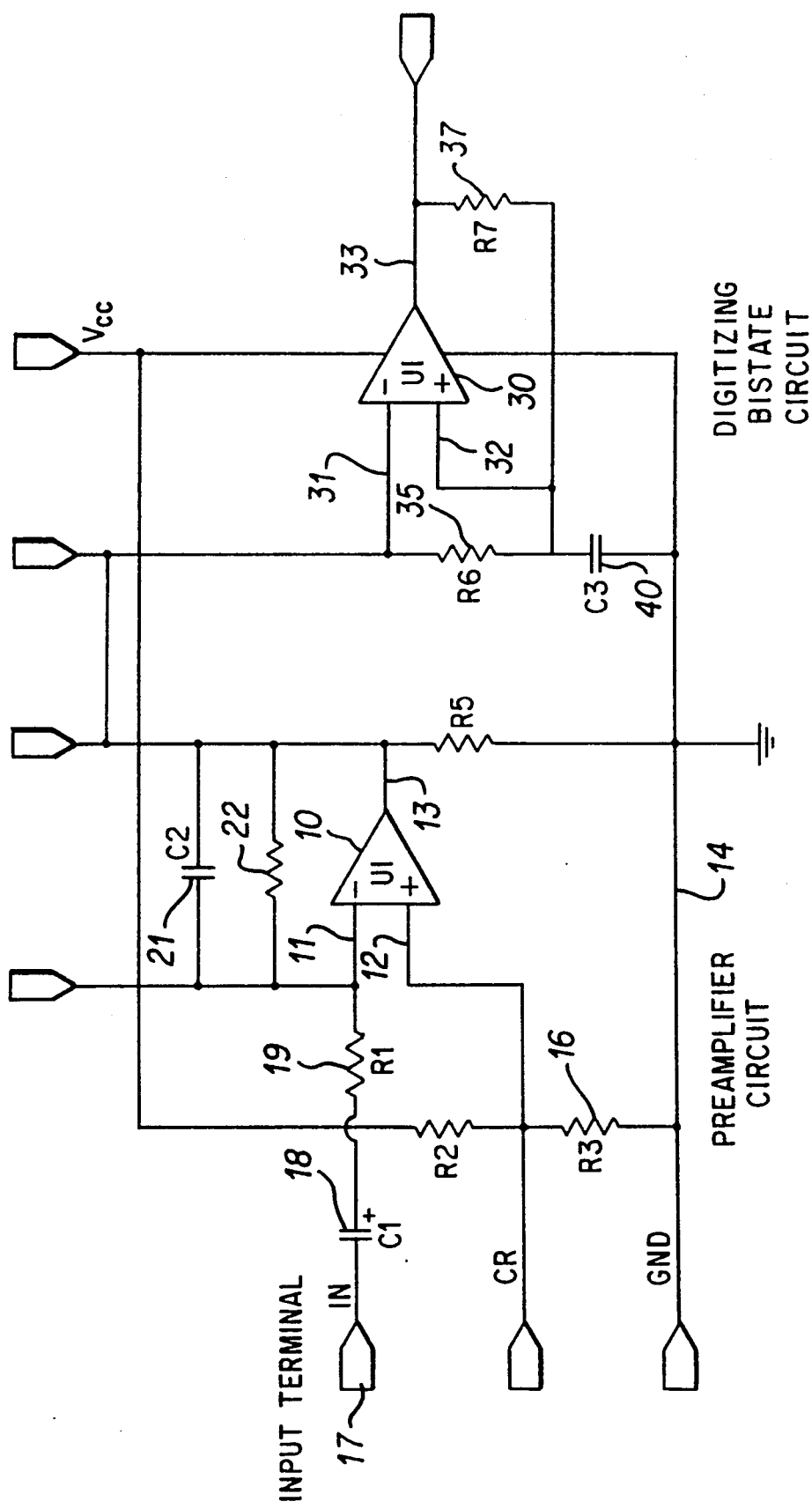
FIG. 2 is a schematic representation of one embodiment of an analog-to-digital converter circuit for extracting time information in accordance with the principles of this invention.

FIG. 2 is a schematic representation of one embodiment of an analog-to-digital converter circuit which is useful for converting an analog signal into a binary signal, at least with respect to the time component of the analog signal. The circuit is provided with a preamplifier 10 having inverting and noninverting inputs 11 and 12, respectively, and an output 13. Noninverting input 12 is coupled to a reference potential 14 via a resistor 16. Inverting input 11 is coupled to an input terminal 17, which receives the analog signal via the series combination of a capacitor 18 and a resistor 19. A feedback capacitor 21 and a feedback resistor 22 are provided across output 13 and inverting input 11 of preamplifier 10. Output 13 is connected to reference potential 14 via a resistor 23.

FIG. 2 further shows a digitizing portion of a circuit having a digitizing comparator 30 having an inverting input, a noninverting input, and an output, 31, 32, 33, respectively. A resistor 35 is connected across inputs 31 and 32, and a resistor 37 is connected across noninverting input 32 and output 33, whereby resistors 35 and 37 form a resistive voltage divider. The node where resistors 35 and 37 are connected to noninverting input 32 is connected to one end of a capacitor 40 which has its other end connected to reference potential 14. In a preferred embodiment, a time constant produced by the combination of capacitor 40 with resistors 35 and 37 is on the order of microseconds.

The amplified analog signal at output 13 of preamplifier 10 is supplied to inverting input 31 of digitizing comparator 30. Output 33 of digitizing comparator 30 therefore produces the above mentioned binary signal which corresponds in frequency to the analog signal.

Figure 2A:
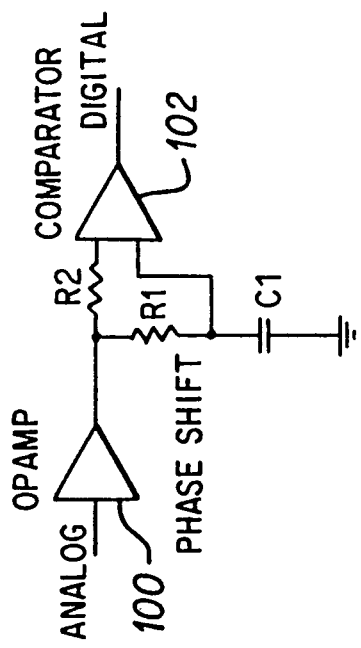
FIG. 2A is a simplified block diagram schematically illustrating the embodiment of FIG. 2.

A simplified block diagram of the embodiment of FIG. 2 is illustrated in FIG. 2A wherein element 100 is a conventional operational amplifier and element 102 is a conventional comparator. In this embodiment, delay is introduced between the signal on one comparator input terminal and the signal on the other comparator input terminal through an RC network comprising resistors R1 and R2 and capacitor C1. Thus, it will be appreciated that the FIG. 2 embodiment represents one simple way to provide a delayed version of the analog input signal through the use of an RC network acting as a delay circuit (i.e., a delay circuit 52 as in FIG. 1).

As mentioned above, the values of the components which introduce the delay are selected to provide a delay on the order of microseconds. This delay will be less than, and preferably quite small in relation to the time between each peak and valley so that the analog signal and its delayed version cross at places close to the peaks and valleys as shown in FIG. 1A.

Other methods for introducing an appropriate delay between the analog input signal and its delayed version are illustrated in FIGS. 3 to 6 wherein like designations have been used to indicate like components.

Figure 3:
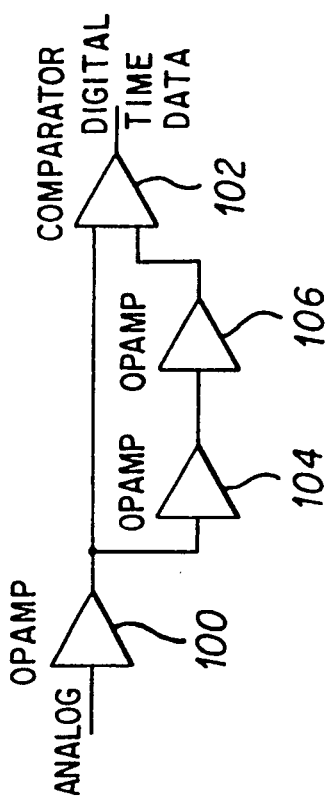
FIG. 3-6 are schematic representations of further embodiments of time extracting circuits according to the present invention.

Referring to FIG. 3, the analog input signal ANALOG is applied to an operational amplifier 100 for preamplification and, if necessary, impedance matching or isolation. The output signal from the operational amplifier 100 is applied directly to one of the two input terminals of a conventional comparator 102 and to the other of the two input terminals of the comparator 102 via first and second operational amplifiers 104 and 106. A propagation delay phase shift is introduced in the path containing the amplifier 104 and 106, so the signal reaching the comparator 102 along this path is delayed slightly (the amount of the propagation delay of the two amplifiers) with respect to the directly applied analog input signal.

Figure 4:
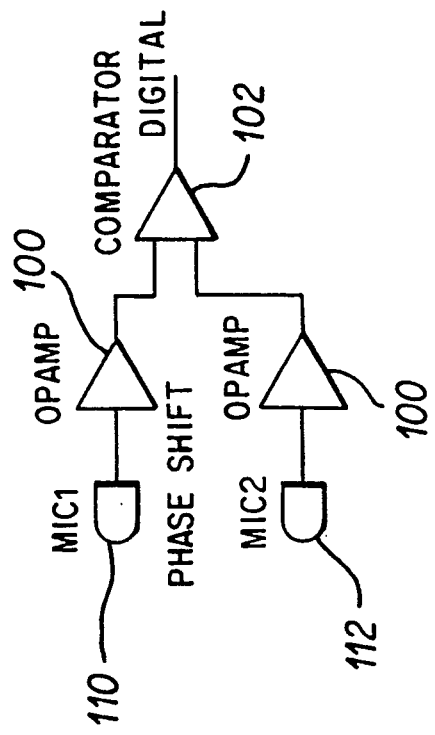

In FIG. 4, a delay or phase shift is introduced between two signals generated by microphones 110 and 112 (MIC 1 and MIC 2) by placing one microphone farther away than the other microphone from the sound source. Thus, if microphone 110 is farther from the sound source, its output signal will be delayed relative to the output signal from microphone 112.

Figure 5:
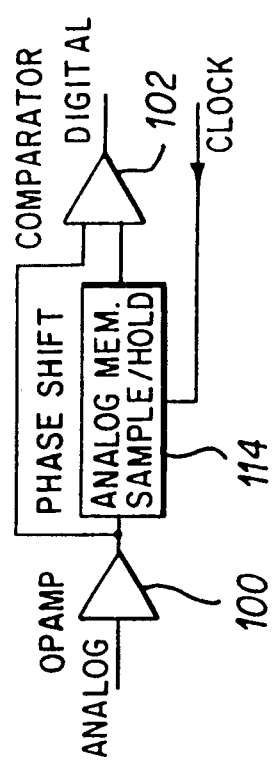

FIG. 5 illustrates an embodiment of a time data extraction circuit which uses an analog sample and hold circuit 119 to introduce a delay. The sample and hold circuit samples and stores the analog signal each time a clock pulse CLOCK is applied. During the interval between clock pulses, the signal level stored by the sample and hold circuit and applied to the comparator 102 remains constant and is always on one side of the analog signal (i.e., greater than or less than) if the analog signal is still changing in the same direction. After a peak or valley is reached, however, the analog signal reverses and the relationship between the stored value and the analog value changes. For example, when a peak is reached, the analog signal, which had been greater than the stored signal, becomes less than the stored signal. This change is detected by the comparator and results in a change in its binary output state.

Figure 6:
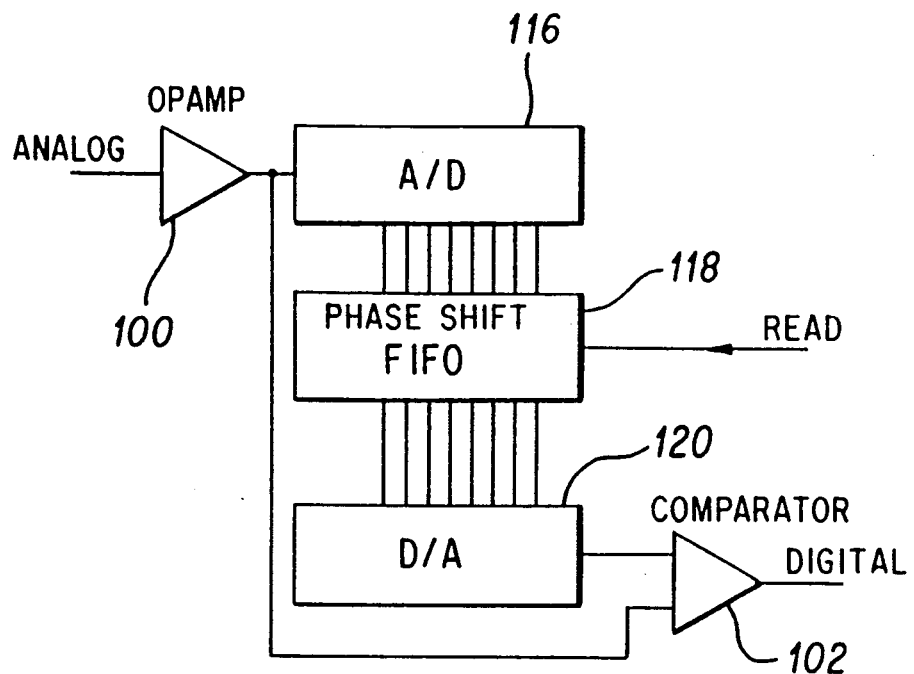

In FIG. 6, a delay is introduced between the analog input signal and the delayed version with which it is compared by a circuit comprising an analog to digital (A/D) converter 116, a first-in, first-out (FIF0) register 118 and a digital to analog (D/A) converter 120. A digital version of the analog input from the A/D converter 116 is clocked into the FIFO by the READ signal. Depending upon the number of stages of the FIFO and the rate of the READ signal, the digital sample of the analog signal is delayed by a predetermined amount, converted back to an analog value, and applied to the comparator 102. The amount of delay thus can be controlled by selection of the rate of the READ signal.

Figure 7:
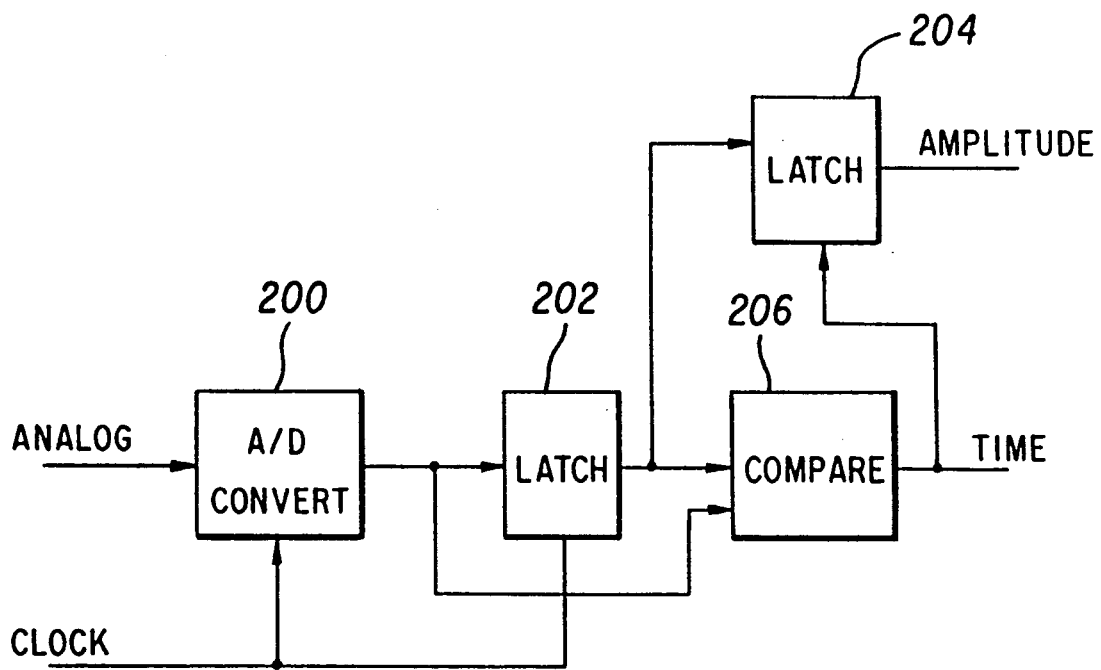
FIG. 7 is a functional block diagram of an embodiment of a time and amplitude extracting circuit according to the present invention.
Figure 8I:
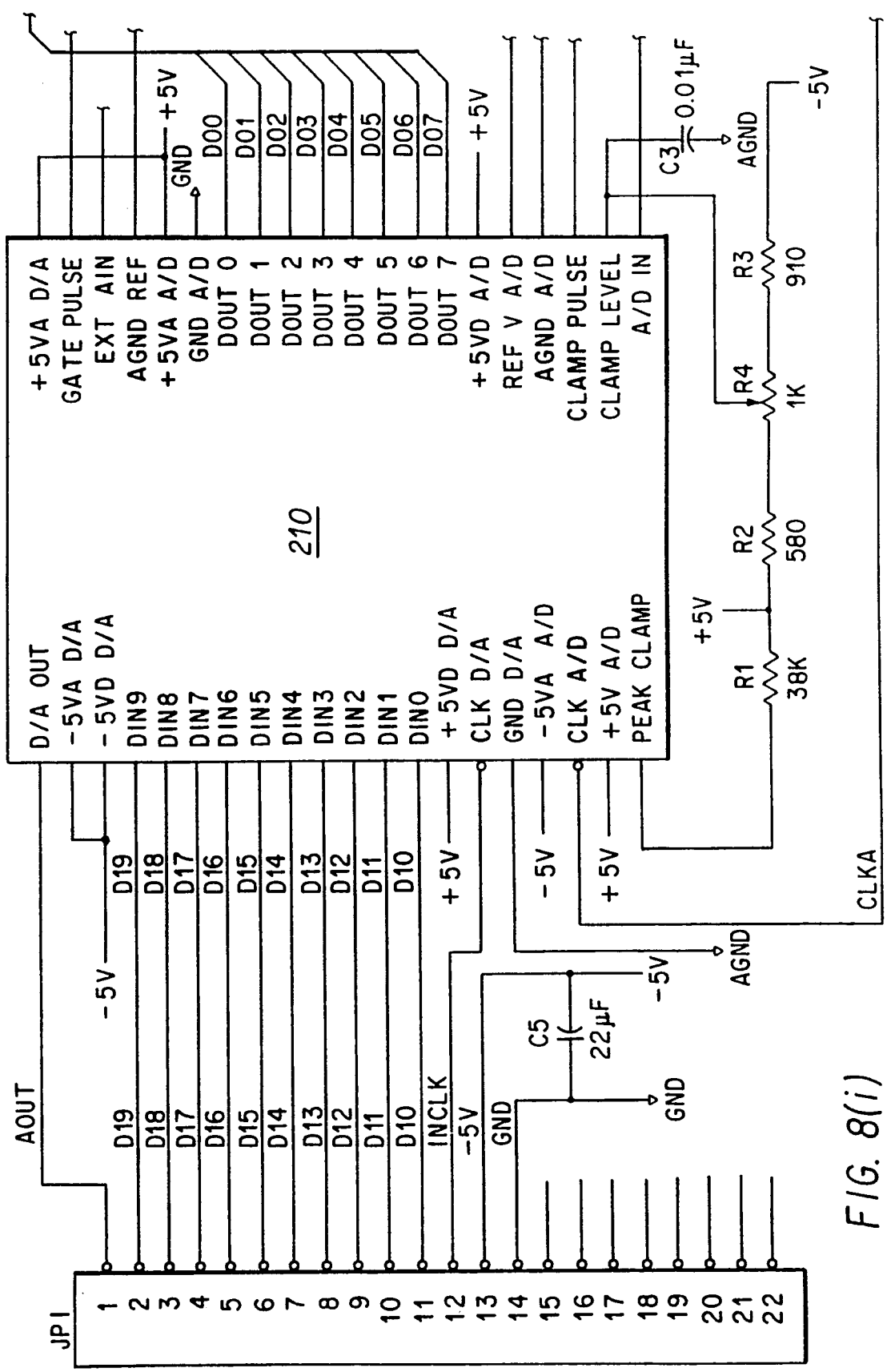
FIG. 8 is a more detailed schematic diagram of an embodiment of the invention according to the principles of FIG. 7.
FIG. 8A is an illustration of typical signal levels at various points in the circuit of FIG. 7.
Figure 8:
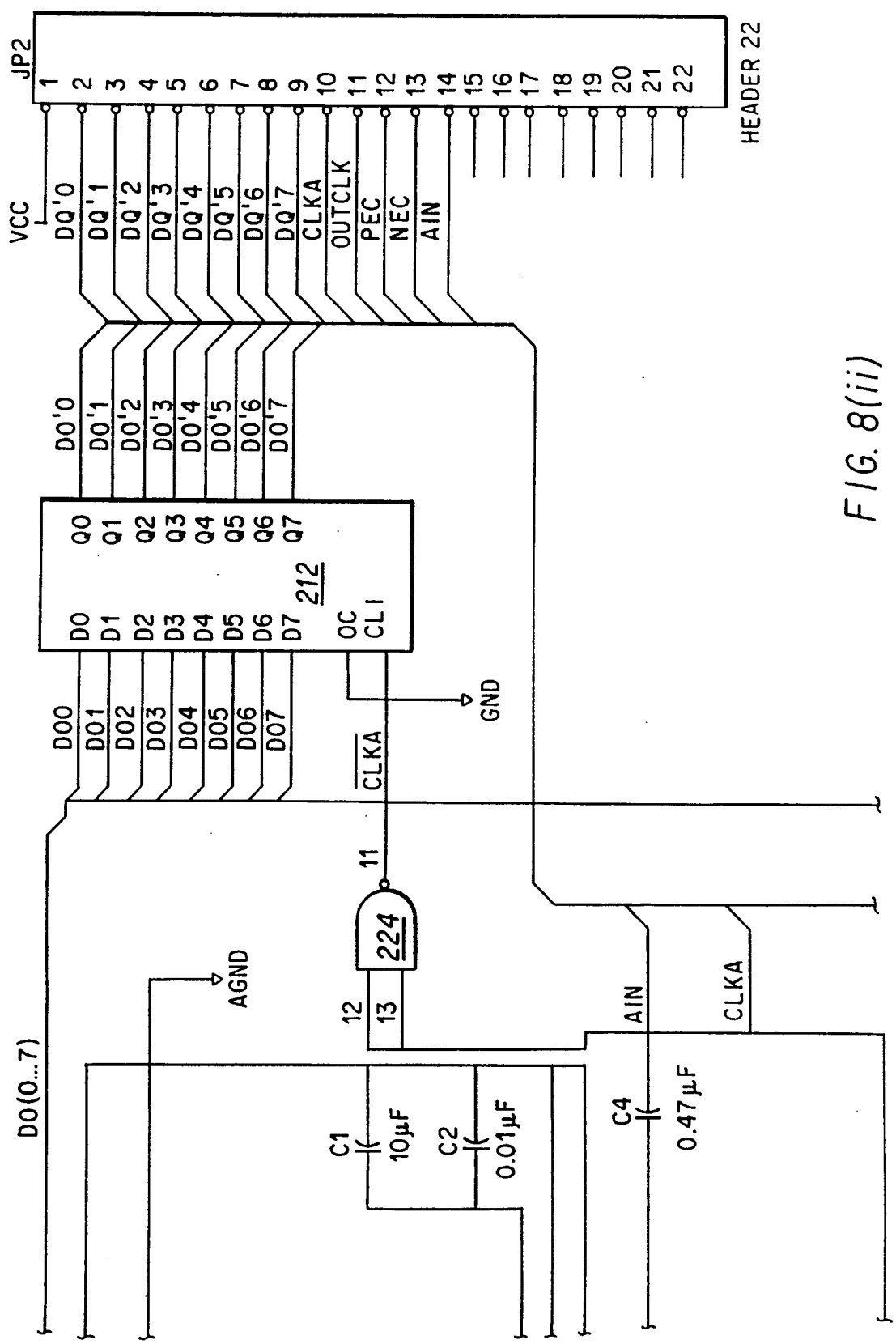

FIG. 7 illustrates a simplified functional block diagram of one embodiment of a time and amplitude extraction circuit according to the invention wherein delay is introduced and comparisons are made between digital signals representing the analog values. FIG. 8 illustrates a more detailed, circuit diagram of an embodiment using this same approach and also including the functional ability to reconstruct the analog signal from the digital time and amplitude components.

Referring first to FIG. 7, the analog input signal is applied to an A/D converter 200 operating at a clock rate preferably more than twice as great as the highest expected frequency of the analog signal. The digital output signal from the A/D converter 200, a sequence of digital representations of the magnitude of the analog signal at regular clock intervals, is applied to the data input terminal of a conventional latch circuit 202, which is clocked by the CLOCK or other suitable enabling signal, in order to temporarily store the digital signals produced by the converter 200. The output signal from the latch 202 is applied to a second latch 204 and to a suitable, conventional digital comparator circuit 206. The digital comparator circuit 206 also receives the digital output signal from the A/D convertor 200, and the latch 204 also receives as an enabling signal the TIME output signal from the comparator 206.

In operation, the input analog signal ANALOG is converted by the A/D converter 200 into a digital form wherein the amplitude of the analog signal at regular sampling intervals (i.e., the CLOCK interval) is represented in digital form by, for example, a four bit binary word. Each digital amplitude value is stored by the latch 202 and thus delayed by the amount of one clock period. Of course, more delay may be introduced, if desired, by having a multi-stage latch.

The comparator 206 compares the delayed amplitude value from the latch 202 with the present or undelayed amplitude value from the converter 200. The comparator 206 may output a pulse or a change in signal level each time the delayed and undelayed amplitude values are equal, although it is preferable in the digital embodiments of FIGS. 7 and 8 to provide an output pulse or change in output signal level each time the difference between the two values changes sign from positive to negative or vice versa.

For example, if the comparator 206 subtracts the delayed signal from the undelayed signal, the difference will be positive or zero when the analog signal amplitude is increasing toward a peak (i.e., has a positive slope). Similarly the difference will be negative or zero when the analog signal amplitude is decreasing toward a valley (i.e., has a negative slope). Each time the analog signal reaches a peak and starts to decrease toward a valley, the difference will change from positive to negative. Similarly, the difference will change from negative to positive when the analog signal reaches a valley and starts to increase toward a peak (see, e.g., FIG. 8A where P represents the undelayed amplitude in digital form and Q represents the delayed amplitude in digital form). Therefore, it will be appreciated that the comparator 206 may subtract the two input signals, detect a change in the sign of the difference of the two input signals, and output a pulse or change in output signal level each time the sign of the difference between the delayed and undelayed amplitude values changes.

With continued reference to FIG. 7, the time output pulse or level change from the comparator 206 is used to trigger or enable the latch 204 so that the latch stores the input signal from the latch 202 at the time of detection of each peak and valley. Thus, the latch 204 stores, in digital form, the delayed amplitude value of the analog input signal at each peak and valley such that the AMPLITUDE signal available in coincidence with the TIME signal represents the amplitude of the peak or valley while the TIME signal represents the time of occurrence of each peak or valley. It will be appreciated that these two output signals are separate and can be separately manipulated, for example, for scrambling purposes or the like. Moreover, the two output signals provide all the information necessary to reconstruct a relatively accurate version of the input analog signal by any suitable digital to analog conversion with suitable smoothing between successive peaks and valleys.

FIG. 8 illustrates an embodiment of the invention like that of FIG. 7 in the sense that the incoming analog signal is converted to digital form and the operations of detecting the times of the peaks and valleys as well as detecting the amplitudes of the peaks and valleys are accomplished by digital signal processing circuits. In addition, the FIG. 8 embodiment includes provision for reconstructing an input analog signal from the digital time and amplitude information extracted from the input analog signal.

Referring to FIG. 8, a suitable, conventional high speed digital to analog (D/A) and analog to digital (A/D) converter 210 includes an analog input terminal A/D IN, digital input terminals DIN0-DIN9, an analog output terminal D/A OUT, digital output terminals DOUT0-DOUT7, a CLK D/A input terminal, and a CLK A/D input terminal, as well as miscellaneous power, ground, and other signals required for proper operation of such devices. The digital output terminals of the converter 210 provide output signals D00-D07 to a conventional latch 212 and to one set of input terminals P0-P7 of a conventional digital comparator 214. The delayed digital output signal D0'0-D0'7 from the latch 212 is provided to the other set of input terminals Q0-Q7 of the comparator 214, and the output signals P=Q and P>Q are supplied to the input terminals of a conventional two-input NAND gate 216. A pair of NAND gates 218 and 220 which together form a conventional flip-flop receive the output signal from the NAND gate 216 and the P>Q output signal from the comparator on the respective set and reset inputs thereof. The output signal from the flip flop gate 220 is supplied to the input terminal of a conventional monostable or one-shot multivibrator 222 which in turn provides the time output signal OUTCLK.

Figure 8A:
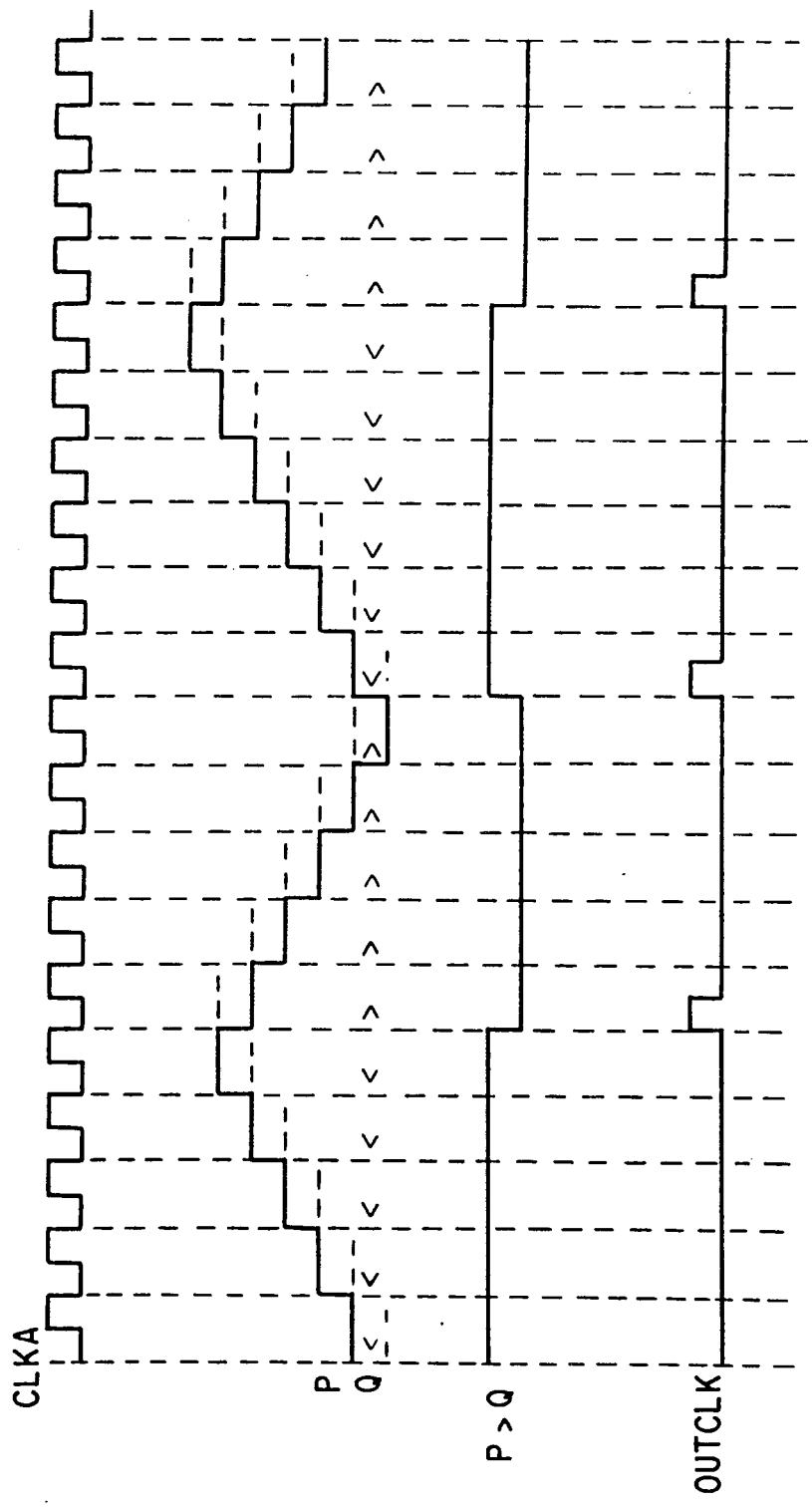

In operation for extracting time and amplitude information from an analog signal, the A/D,D/A converter 210 receives an analog input signal AIN together with a system A/D clock CLKA. The converter 210 samples the analog signal at the input clock rate and provides amplitude values of the analog signal at regular intervals in the form of the output signal D00-D07. The D00-D07 output signal is delayed by the latch 212 by a time period determined by the clock signal CLKA which is inverted by inverter 224 and applied to the clock input terminal of the latch 212. The delayed and undelayed versions of the amplitude samples Q and P, respectively, are compared by the comparator 214 as is diagrammatically illustrated in FIG. 8A. As a result, the P>Q* (the inverse or "barred" version of the P>Q signal) from the flip flop gate 220 changes level at the occurrence of each peak and valley as shown in FIG. 8A. Since this signal triggers the one shot 222, the output clock signal OUTCLK from the one shot 222 is a pulse which occurs at each peak and valley, and the time between successive OUTCLK pulses represents the time between successive peaks and valleys.

The OUTCLK signal and the D0'0-D0'7 signal thus provide time and amplitude information which may be stored or used as desired. Of course, as in FIG. 7 embodiment, the amplitude value represented by the D0'0-D0'7 output signal may be stored or otherwise used in response to the OUTCLK peak-to-valley time signal if it is desired to store or otherwise process only the peak and valley amplitudes. Similarly, the peak-to-valley time information may be converted from OUTCLK pulses to digital words for storage and later retrieval, e.g., by starting a conventional binary counter in response to each OUTCLK pulse and storing the counter output signal as time data immediately before each OUTCLK pulse restarts the counter.

The mode of operation of the embodiment of FIG. 8 wherein the digital time and amplitude information is used to reconstruct an analog signal will now be explained. Peak and valley amplitude information of an analog signal is supplied from a memory or other source to the DIN input terminals of the converter 210 as the digital input signal DI0-DI7. The time information is supplied to the CLK D/A input terminal of the converter 210 in the form of an input clock signal INCLK derived from the time information corresponding to the amplitude information of the analog signal to be reconstructed. The result will be the analog output signal AOUT from the D/A OUT terminal of the converter 210. This analog output signal will step from peak to valley or valley to peak at each INCLK pulse, so the analog signal may require smoothing or some form of filtering before it is used. In the case of sound, particularly speech, smoothing or filtering may not be necessary because of the limited range of the analog signal, the natural smoothing tendencies of electro-mechanical speakers, and the acceptability of less fidelity with speech than with other analog signals.

It will be appreciated that the present invention has numerous applications, not only in situations where A/D converters normally are useful but in situations where other types of devices might normally be used. The typical application might be, for example, in digital sound recording wherein an analog signal is converted to a digital form for storage on a record medium such as a laser disc. The advantage of the present invention in such an application is, of course, that it may be possible to record music or other sound with sufficiently accurate reproduction using considerably less storage space on the record medium. The same advantage may be possible in digital communications systems in the sense that the efficiency of the system and/or the bandwidth requirements for transmission of a certain amount of data may be significantly improved if the analog information is converted to a digital form in accordance with the present invention.

Other applications of the present invention which differ from the typical, apparent applications for analog to digital converters may include functions such as demodulation. For example, an amplitude modulated signal may be demodulated by applying it to a circuit according to the present invention and extracting time and amplitude data from the modulated carrier. Since the carrier frequency is constant, the amplitude data will represent the amplitude modulation information on the carrier. Similarly, it will be appreciated that time or phase information can be extracted from an analog signal using the time extraction principles of the present invention. Moreover, as was previously mentioned, highly secure scrambling of an analog signal can be accomplished using a converter according to the present invention since the time and amplitude components are separate and can be independently manipulated and scrambled. This allows a degree of security that may far surpass the typical prior art approaches such as rearrangement of digital words representing amplitude wherein time is always constant as in normal digital versions of analog signals.

Although the invention has been described in terms of specific embodiments and applications, persons skilled in the art, in light of this teaching can generate additional embodiments without exceeding the scope or departing from the spirit of the claimed invention. For example, although the invention has been described in terms of hardware embodiments, it will be appreciated that most if not all of the principles of the invention may be implemented in software. Accordingly, it is to be understood that the drawings and descriptions in this disclosure are proffered to facilitate comprehension of the invention and should not be construed to limit the scope thereof.

What is claimed is:

1. A converter circuit for converting into binary information an input analog signal having a time-varying amplitude producing amplitude peaks and valleys, the converter circuit comprising digitizer means having an input for receiving the input analog signal and an output for providing a binary signal in the form of a sequence of binary states having durations responsive to the time between peaks and valleys of the input analog signal, the digitizer means including means for producing a delayed version of the input analog signal, and means for comparing the input analog signal with the delayed version and changing the state of said binary signal in response to a predetermined relationship between said input analog signal and said delayed version.

2. The converter circuit of claim 1 wherein there is further provided amplifier means in said digitizer means, said amplifier means having inverting and noninverting inputs, said input receiving the input analog signal being said inverting input, and an amplifier output.

3. The converter circuit of claim 2 including feedback means coupling said amplifier output to said noninverting input.

4. The converter circuit of claim 3 wherein said feedback means comprises:
first resistor means coupled across said inverting and noninverting inputs; and
second resistor means coupled across said inverting and noninverting inputs; and
capacitor means coupled across said noninverting input and a reference potential, wherein said capacitor means and said first and second resistor means establish a predetermined time constant.

5. The converter circuit of claim 1 wherein there is further provided preamplifier means having an input for receiving the input analog signal and an output coupled to said input of said digitizer means for providing an amplified version of the input analog signal.

6. The converter circuit of claim 5 wherein there is further provided frequency-responsive negative feedback means for coupling said input said output of said preamplifier means.

7. A circuit for representing in digital form durations between amplitude peaks and valleys of an analog time-varying input signal, the circuit comprising:
means for delaying the time-varying input signal; and
means for comparing the magnitudes of the time-varying input signal and the delayed time-varying input signal to produce a transition in a digital output signal each time a differential magnitude of the compared signals has a predetermined value.

8. The circuit of claim 7 wherein said transition in the digital output signal is produced each time the magnitudes of the compared signals are approximately equal.

9. The circuit of claim 7 wherein said transition in the digital output signal is produced each time a reversal in magnitude of the compared signals occurs.

10. The circuit of claim 7 wherein said delaying means comprises means for delaying the time-varying input signal by an amount less than the time of one-half of the shortest expected cycle of the time-varying input signal.

11. The circuit of claim 7 including means for providing a digital representation of the amplitude of the time-varying input signal for each transition of said digital output signal.

12. A method for representing in digital forms durations between amplitude peaks and valleys of an analog time-varying input signal, the method comprising the steps of:
delaying the time-varying input signal;
comparing the magnitudes of the time-varying input signal and the delayed time-varying input signal; and
producing a transition in a digital output signal each time a differential magnitude of the compared signals has a predetermined value.

13. The method of claim 12 wherein said transition in the digital output signal is produced each time the magnitudes of the compared signals are approximately equal.

14. The method of claim 12 wherein said transition in the digital output signal is produced each time a reversal in magnitude of the compared signals occurs.

15. The method of claim 12 wherein the step of delaying comprises delaying the time-varying input signal by an amount less than the time of one-half of the shortest expected cycle of the time-varying input signal.

16. The method of claim 12 wherein the transition in the digital output signal is produced by subtracting the amplitudes of the time-varying input signal and the delayed time-varying input signal to produce a difference amplitude, and producing said transition each time the sign of the difference amplitude changes.

17. The method of claim 16 including the step of providing a digital representation of the amplitude of the time-varying input signal at each transition of the digital output signal.

18. The method of claim 1 including the step of converting the time-varying input signal into a digital input signal comprising a sequence of amplitude samples at regular intervals, and wherein the steps of delaying and comparing are performed on the digital input signal.

19. The method of claim 12 including the step of storing the time between successive transitions of the digital output signal as one characteristic of the time-varying input signal.

20. The method of claim 19 including the steps of providing a digital representation of the amplitude of the time-varying input signal at each transition of the digital output signal to produce a sequence of digital amplitude representations corresponding to the amplitudes of the peaks and valleys of the time-varying input signal, and storing the sequence of digital amplitude representations as a characteristic of the time-varying input signal.

21. The method of claim 12 including the steps of providing a digital representation of the amplitude of the time-varying input signal at each transition of the digital output signal to produce a sequence of digital amplitude representations corresponding to the amplitudes of the peaks and valleys of the time-varying input signal, and storing the sequence of digital amplitude representations as a characteristic of the time-varying input signal.

22. The method of claim 20 including the step of reconstructing the time-varying input signal in response to the sequence of digital amplitude representations and the transitions in the digital output signal by producing an analog signal level in response to each digital amplitude representation in said sequence thereof at times determined by the transitions in the digital output signal.

23. A circuit for extracting amplitude information from a time-varying input signal comprising:
   means for delaying the time-varying input signal by an amount less than one half of the shortest expected cycle thereof;
   means responsive to the amplitudes of time-varying input signal and the delayed time-varying input signal for producing a digital output signal each time a predetermined relationship exists between said amplitudes; and
   means for extracting the amplitude of the time-varying input signal in response to said digital output signal.

24. The circuit of claim 23 wherein said means for producing said digital output signal comprises means for comparing said amplitudes, and means for producing said digital output signal each time the amplitudes are approximately equal.

25. The circuit of claim 23 wherein said means for producing said digital output signal comprises means for comparing said amplitudes, and means for producing said digital output signal each time a reversal in amplitude of the compared amplitudes occurs.

26. The circuit of claim 25 wherein said extracting means comprises means for selectively providing the amplitude of the delayed time-varying input signal in response to the digital output signal.

27. The circuit of claim 23 wherein said digital output signal producing means comprises means for comparing the relative amplitudes of said time varying input signal and said delayed time-varying input signal and producing said digital output signal each time a predetermined relationship occurs, and wherein said extracting means comprises means for selectively providing the amplitude of the delayed time-varying input signal in response to the digital output signal.

* * * * *